(12) United States Patent
Slawik et al.

(10) Patent No.: US 11,540,411 B2
(45) Date of Patent: Dec. 27, 2022

(54) FASTENER AND COUPLING FOR CONNECTING A CIRCUIT BOARD TO A MOUNT

(71) Applicant: Aptiv Technologies Limited, St. Michael (BB)

(72) Inventors: Ralf Slawik, Dublin (IE); Thorsten Mauff, Dublin (IE)

(73) Assignee: Aptiv Technologies Limited, St. Michael (BB)

( * ) Notice: Subject to any disclaimer, the term of this patent is extended or adjusted under 35 U.S.C. 154(b) by 91 days.

(21) Appl. No.: 17/233,155

(22) Filed: Apr. 16, 2021

(65) Prior Publication Data
US 2021/0392769 A1 Dec. 16, 2021

(30) Foreign Application Priority Data
Jun. 11, 2020 (EP) .................................... 20179580

(51) Int. Cl.
*H05K 7/14* (2006.01)
*F16B 2/20* (2006.01)
*H05K 1/02* (2006.01)

(52) U.S. Cl.
CPC ............ *H05K 7/1405* (2013.01); *F16B 2/20* (2013.01); *H05K 1/02* (2013.01); *H05K 2201/09063* (2013.01)

(58) Field of Classification Search
CPC ........ H05K 7/1405; H05K 7/142; H05K 7/12; H05K 1/02; H05K 2201/09063; F16B 2/20; F16B 9/056; F16B 9/07; F16B 9/09; F16B 5/0664; F16B 5/065; F16B 21/071; F16B 21/065; F16B 19/002; F16B 5/10; F16B 2019/006
(Continued)

(56) References Cited

U.S. PATENT DOCUMENTS 4,176,428 A * 12/1979 Kimura .................. F16B 21/06
411/509
5,223,674 A * 6/1993 Reznikov ............... H05K 7/142
361/759
(Continued)

FOREIGN PATENT DOCUMENTS

DE      9115131       2/1992
DE   102010030964    1/2012
(Continued)

OTHER PUBLICATIONS

"Extended European Search Report", EP Application No. 20179580. 4, dated Sep. 3, 2020, 9 pages.

*Primary Examiner* — Anatoly Vortman
*Assistant Examiner* — Zhengfu J Feng
(74) *Attorney, Agent, or Firm* — Sawtooth Patent Group PLLC (57) ABSTRACT

A coupling for connecting a circuit board to a mount with a fastener. The mount may be connected to a component. The fastener includes a first snap-fit connection formation for establishing a snap-fit connection with a second snap-fit connection formation provided on the mount. When connected, the fastener clamps the circuit board against the mount. The fastener further includes a first engagement formation configured to engage with a second engagement formation on the mount for bracing the snap-fit connection.

20 Claims, 6 Drawing Sheets

(58) Field of Classification Search
USPC .......................................................... 361/748
See application file for complete search history.

(56) References Cited

U.S. PATENT DOCUMENTS

| | | | |
|---|---|---|---|
| 5,281,149 A | | 1/1994 | Petri |
| 5,754,412 A * | | 5/1998 | Clavin .................. H05K 7/142 |
| | | | 24/453 |
| 5,786,989 A | | 7/1998 | Kawabe |
| 6,071,131 A * | | 6/2000 | Pliml, Jr. ............... H05K 7/142 |
| | | | 439/95 |
| 7,059,025 B2 | | 6/2006 | Edland |
| 2008/0145186 A1 | | 6/2008 | Jin |
| 2010/0254078 A1 * | | 10/2010 | Zheng .................. H05K 7/142 |
| | | | 361/752 |
| 2015/0375799 A1 | | 12/2015 | Morris et al. |

FOREIGN PATENT DOCUMENTS

| | | |
|---|---|---|
| DE | 102011052190 | 1/2013 |
| DE | 102012013144 | 1/2014 |
| DE | 102013218649 | 9/2014 |
| DE | 202013011533 | 3/2015 |
| DE | 202015101103 | 6/2016 |
| DE | 102017108713 | 10/2018 |
| JP | 2007234860 | 9/2007 |
| WO | 2016063214 | 4/2016 |

\* cited by examiner

FASTENER AND COUPLING FOR CONNECTING A CIRCUIT BOARD TO A MOUNT

CROSS-REFERENCE TO RELATED APPLICATION

This application claims priority to European Patent Application Number 20179580.4, filed Jun. 11, 2020, the disclosure of which is hereby incorporated by reference in its entirety herein.

BACKGROUND

The present disclosure relates to a fastener, a mount for receiving a fastener, and a coupling for use in connecting a circuit board to a component, such as cover or housing. The present disclosure is particularly relevant to plastic clip fasteners for fixing or mounting a printed circuit board without needing to utilise screws.

It is common to mount printed circuit boards within a plastic housing or cover. Conventionally, the circuit board will be placed on a number of mounting projections provided at the mounting location within the housing or cover, and be fixed into place using metal screws, which are screwed through apertures in the circuit board into each mounting projection. As such, the mounting projections provide a plurality of support struts for separating the circuit board from the housing or cover, which provides space for surface mounted components and airflow around the circuit board.

However, the use of screws does present a number of issues. Firstly, simultaneously aligning the screws with both the circuit board apertures and the mounting projections is a relatively complex operation, and any misalignment can lead to poor fixation or even damage to the assembly itself. Similarly, the screws are prone to mis-threading or breakage. Furthermore, as the screws are screwed in, the thread-cutting process removes material from the mounting projections in the form of chips and particulates, which then have to be removed from the assembly. These factors in turn necessitate the use of specialist equipment to mitigate the risk of damage during screw insertion, and to clean the assembly once the screws have been installed, which adds to the cost and the production cycle time during installation.

There is therefore a need for an improved coupling for fixing a circuit board to a component.

SUMMARY

The present disclosure concerns a fastener and co-operating mount which provide a coupling for securing a circuit board to a component without the need for screws.

According to a first aspect, there is provided a fastener for connecting a circuit board to a mount, comprising: a first snap-fit connection formation for establishing a snap-fit connection with a second snap-fit connection formation provided on the mount for securing the circuit board thereto; and a first engagement formation configured to engage with a second engagement formation on the mount for bracing the snap-fit connection.

In this way, a circuit board fastener is provided which allows a circuit board to be fixed to a mount on another component, such as a cover or housing, without the need for screws. Once established, the snap-fit connection formations provide a resiliently secured coupling, which is further strengthened by the bracing of the engagement formations. As such a secure fixing of the circuit board is achieved, without the disadvantages associated with screws. The fastener may be formed of a polymer material.

In embodiments, when connected, the fastener clamps the circuit board against the mount. In this way, the circuit board may be pressed between the fastener and the mount to secure it in position.

In embodiments, the fastener includes a collar for clamping the circuit board against the mount. In this way, the collar may provide a flattened clamping surface for pressing into the circuit board to hold it in position.

In embodiments, the first snap-fit connection formation includes a male snap-fit member and the second snap-fit connection formation includes a female snap-fit member for receiving the male snap-fit member. In this way, the fastener may be provided as a compact body having a simple snap-fit pin, which can then be received into a corresponding hole formed in the larger mount. This thereby minimises the space required on the circuit board to accommodate the fastener.

In embodiments, the male snap-fit member includes a stud projection for engagement into a detent defined within the female snap-fit member.

In embodiments, the stud projection is a ball stud. In this way, the rounded profile of the distal hemisphere of the stud facilitates its entry into the female snap-fit member, whilst the proximal hemisphere provides a retention surface for resisting its withdrawal once received within the detent. At the same time, the ball stud allows some rotational movement for aligning the circuit board relative to the mount.

In embodiments, engagement of the first engagement formation with the second engagement formation prevents deflection of one of the first and second snap-fit connection formations. In this way, the engagement formations act to resist the loosening of the connection between the snap-fit connection formations.

In embodiments, the first engagement formation includes a projection for engaging the second engagement formation provided on an outer surface of the second snap-fit connection formation. In this way, the second snap-fit connection formation is held in its connected state by the first engagement formation, thereby establishing an interlocking arrangement between the fastener and the mount.

In embodiments, at least one of the first and second engagement formations includes a tapered surface. In this way, the engagement between the engagement formations may act to direct them into the bracing position for bracing the snap-fit connection. In embodiments, the ramped configuration of the engagement formations may act to increase the bracing force applied as snap-fit connection is established. In embodiments, the tapered surface is angled at 45-85 degrees to the direction at which the fastener is connected, and more preferably at 50-70 degrees to the direction at which the fastener is connected. In embodiments, the length of the tapered surface is between 40-60% of the length of the respective engagement formation in the direction at which the fastener is connected.

In embodiments, engagement of the first engagement formation with the second engagement formation defines the axial alignment of the fastener relative to the mount. In this way, the configuration of the engagement formations may allow the implementation of arrangements with different alignments between the fastener and the mount. As such, the fastener may be used with mounts with different degrees of incline, whilst still allowing the circuit board to be held in the desired plane. In embodiments, the mount may further comprise a support surface for supporting the circuit board in a plane determined by the axial alignment of the fastener relative to the mount.

In embodiments, the first engagement formation is configured to key through an aperture provided in the circuit board for preventing rotation of the circuit board relative to the fastener once the snap-fit connection is established. In this way, the circuit board is prevented from horizontal rotation relative to the fastener. In embodiments, the fastener forms a press-fit connection with the aperture for resisting the fastener's detachment from the circuit board.

According to a second aspect, there is provided a mount for receiving a fastener for connecting a circuit board to the mount, comprising: a second snap-fit connection formation for establishing a snap-fit connection with a first snap-fit connection formation provided on the fastener for securing the circuit board thereto; and a second engagement formation configured to engage with a first engagement formation on the fastener for bracing the snap-fit connection.

In this way, a circuit board mount is provided which allows a circuit board to be fixed in place using a simple snap-fit fastener, without the need for screws. Once established, the snap-fit connection formations provide a resiliently secured coupling, which is further strengthened by the bracing of the engagement formations. As such, a secure fixing of the circuit board is achieved, without the disadvantages associated with screws. The mount may be formed of a polymer material. The mount may be integrally formed with a component, such as a housing or cover.

In embodiments, the second snap-fit connection formation includes two or more resiliently deformable arms defining a female snap-fit member, and wherein the first snap-fit connection formation includes a male snap-fit member for insertion into the female snap-fit member. In this way, the two or more deformable arms may secure the male snap-fit member by gripping around it under the force applied by their elastic recoil.

In embodiments, the second engagement formation is provided on an outer surface of the two or more deformable arms such that engagement by the first engagement formation braces the leaves for preventing their deformation.

In embodiments, the mount may further comprise a support surface for supporting the circuit board in a plane determined by the axial alignment of the fastener relative to the mount.

According to a third aspect, there is provided a coupling for connecting a circuit board to a component, the coupling comprising: a mount connected to the component; and a fastener connectable to the mount for securing the circuit board thereto; wherein the fastener includes a first snap-fit connection formation for establishing a snap-fit connection with a second snap-fit connection formation provided on the mount for securing the circuit board thereto; and wherein the fastener further includes a first engagement formation configured to engage with a second engagement formation on the mount for bracing the snap-fit connection.

According to a fifth aspect, there is provided a circuit board for use with the above fastener, the circuit board comprising an aperture for receiving the first snap-fit connection formation and the first engagement formation in a keyed arrangement. In embodiments, the aperture forms a press-fit connection with the fastener for resisting its detachment from the circuit board.

BRIEF DESCRIPTION OF THE DRAWINGS

An illustrative embodiment will now be described with reference to the accompanying drawing in which.

DETAILED DESCRIPTION

Figure 1:
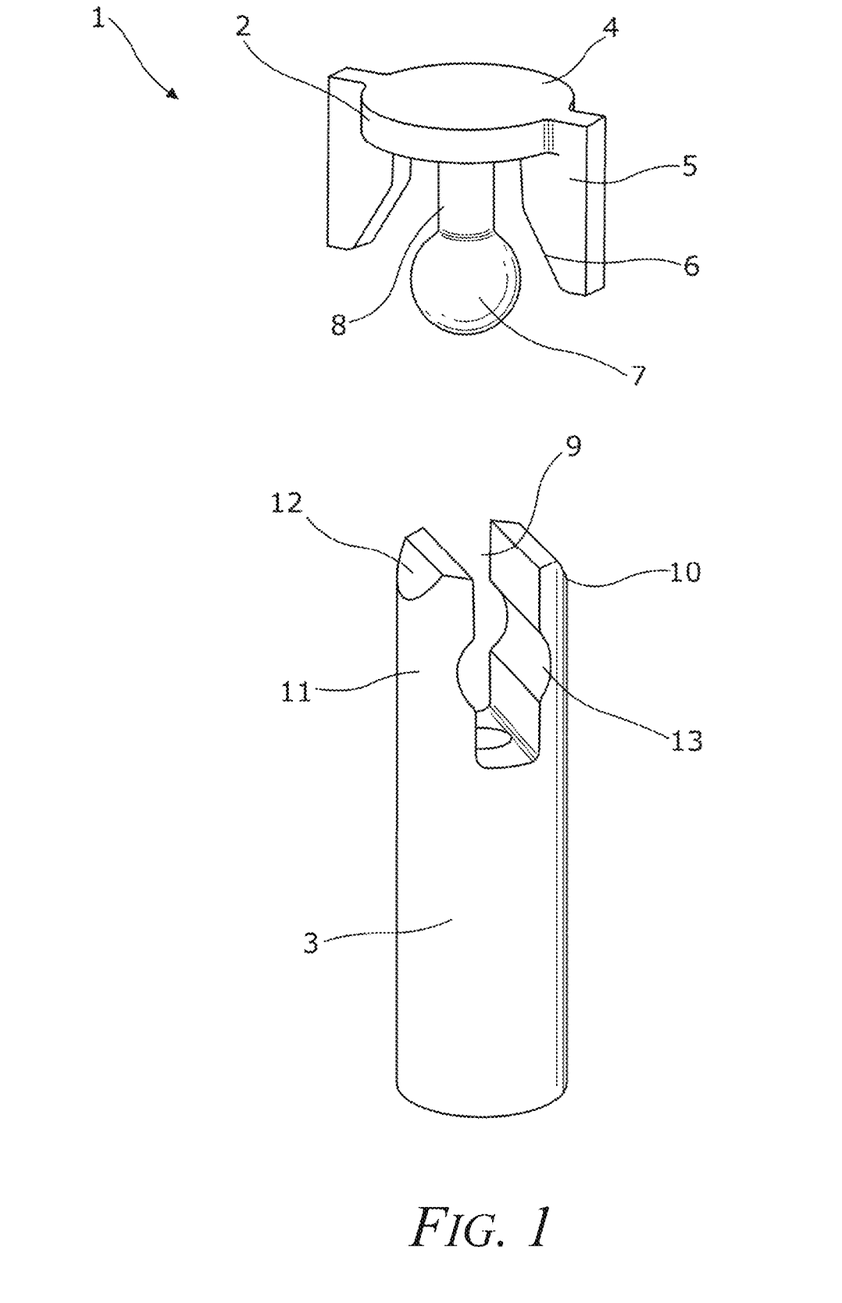
FIG. 1 shows an isometric view of a coupling of a first embodiment.

FIG. 1 shows a first embodiment of a coupling 1 comprising a fastener 2 and a mount 3 for receiving the fastener 2 for connecting a circuit board to the mount 3. In this embodiment, the fastener 2 and the mount 3 is formed of a plastic material, with the mount 3 connecting to a larger component, such as a cover or housing (not shown in this Figure).

The fastener 2 includes a ball stud 7 mounted on the distal end of a central shaft 8 which forms a first snap-fit part. The proximal end of the shaft 8 terminates in a circular collar 4, which provides a flat distally facing surface. The fastener 2 further includes an engagement formation provided as two engagement projections 5, which are located either side of the shaft 8. The engagement projections 5 taper outward as they extend distally down from the collar 4, forming opposing ramped first engagement surfaces 6 either side of the shaft 8 and ball stud 7. In this embodiment, the ramped first engagement surfaces 6 are tapered at an angle of around 55 degrees to the vertical. In this embodiment, the length of each ramped first engagement surface 6 is approximately 50% of the vertical length of the respective engagement formation 5.

The mount 3 is provided as a support column for supporting a circuit board (not shown) above a component (not shown) connected to the base of the mount. The proximal end of the mount 3 divides into two arms 10, 11, separated by a gap 9, which form a second snap-fit part. The width of gap 9 is less than the diameter of ball stud 7. The opposing inner surfaces of the two arms 10, 11 are provided with detents 13 which form rounded channels for mating with the surface of the ball stud 7. The outer surface of the proximal ends of the two arms 10, 11 taper inward forming second ramped engagement surfaces 12. The terminal faces of the proximal ends of the two arms 10, 11 provide a support surface onto which the circuit board is seated.

Figure 2:
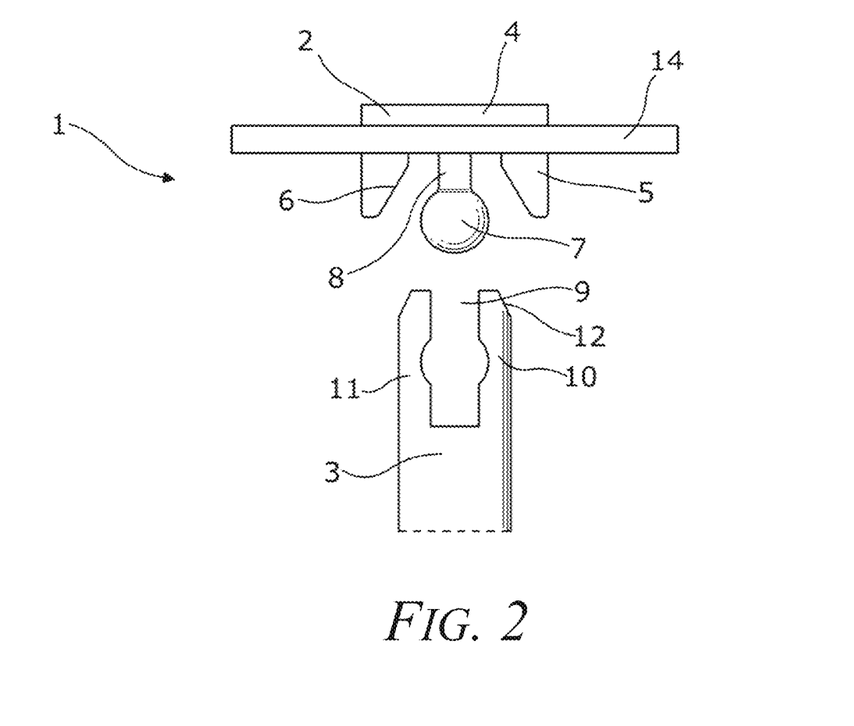
FIG. 2 shows a side view of the coupling with a circuit board when unconnected.
Figure 3:
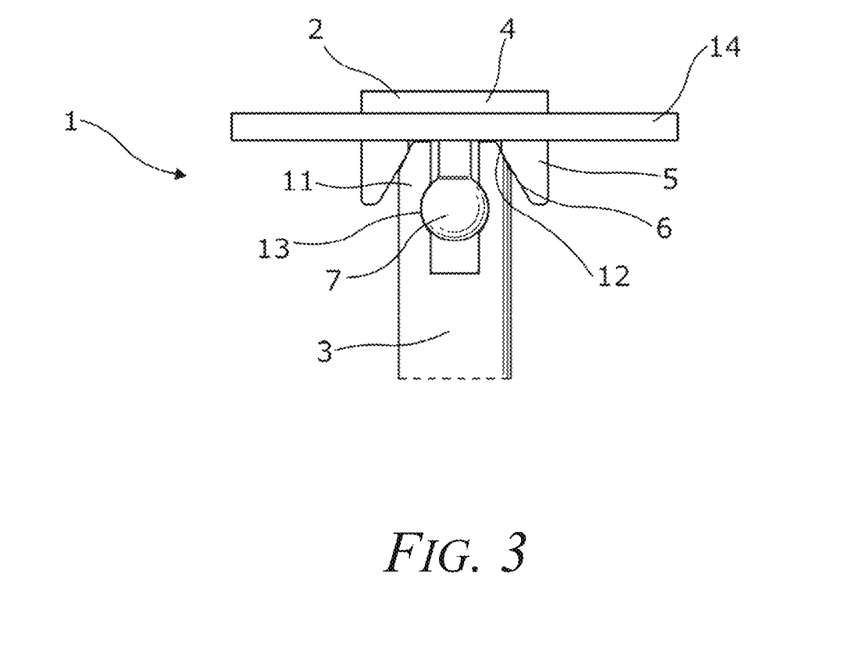
FIG. 3 shows a side view of the coupling with the circuit board when connected.

FIGS. 2 and 3 respectively show a side view of the coupling 1 with a circuit board 14 when unconnected and connected. As shown in FIG. 2 and described below in further detail in relation to FIGS. 4 and 5, the fastener 2 is fitted through an aperture in the circuit board 14, with the collar 4 seated on the circuit board's top surface. The fastener's first engagement surfaces 6, as well as the shaft 8 and ball stud 7 extend though the circuit board 14, such that they project distally below the circuit board's bottom surface.

The fastener 2 is forced distally into the mount 3 to connect the first and second snap-fit parts. This may be done manually, with the proximal face of collar 4 providing an enlarged area for the user to press down on. Establishing the connection acts to clamp the circuit board 14 between the collar 4 and the proximal end of the mount 3. In this operation, the ball stud 7 is inserted into the gap 9 at its proximal end, forcing the two arms 10, 11 to resiliently deform outward to accommodate it. The arms 10, 11 continue to flex outward until the ball stud 7 reaches the detents 13, at which point the two arms 10, 11 recoil inward for mating around the surface of the ball stud 7. As shown in FIG. 3, the snap-fit connection is thereby established by the ball stud 7 being received within the detents 13.

At the same time as the above, the first engagement surfaces 6 on the fastener 2 engage with the second engagement surfaces 12 provided on the outside of the arms 10, 11 of the mount 3. The tapering of the first and second engagement surfaces 6, 12 provide a ramped engagement for directing the proximal ends of the arms 10, 11 radially inward. As such, once the snap-fit connection is established, the arms 10, 11 are braced from deforming outward by engagement between the first and second engagement surfaces 6, 12. This acts to maintain the resilient clamping force applied by the arms 10, 11 through the detents 13. That is, the first and second engagement surfaces 6, 12 act as an interlock for resisting loosening of the snap-fit connection. In embodiments, the engagement surfaces may be profiled to actively compress the proximal ends of the arms 10, 11 inwards toward the shaft 8 for locking the detents 13 around ball stud 7.

Figure 4:
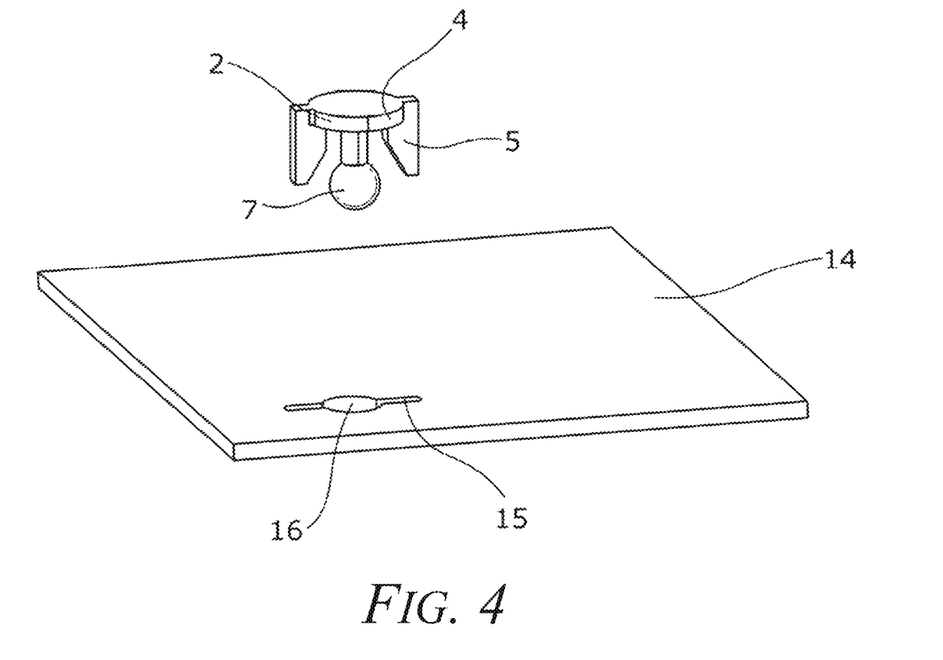
FIG. 4 shows an isometric view of the coupling's fastener above a circuit board.
Figure 5:
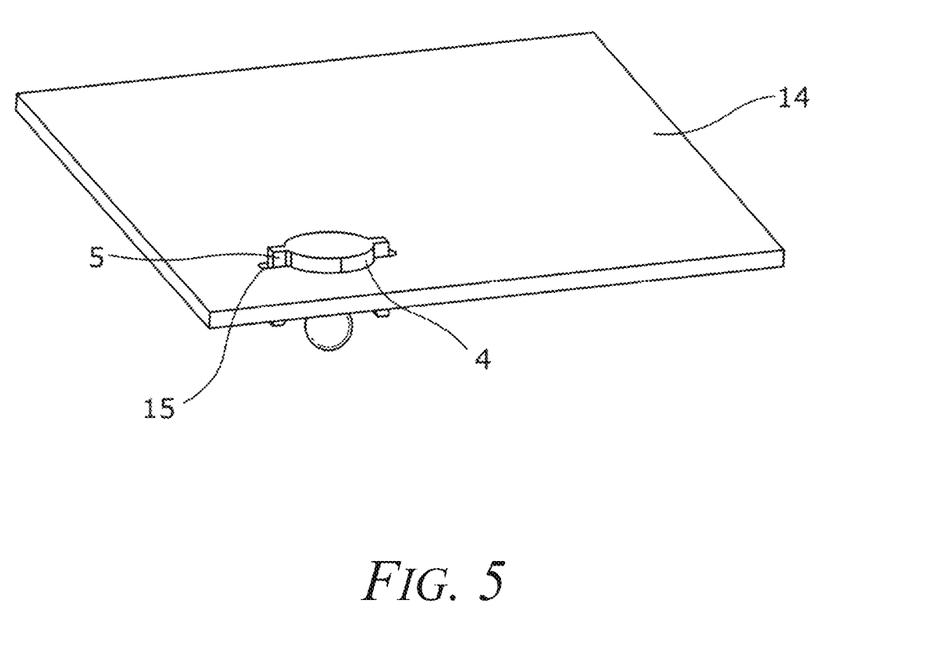
FIG. 5 shows an isometric view of the coupling's fastener once inserted into the circuit board.

FIGS. 4 and 5 further show the connection between the fastener 2 and circuit board 14. Circuit board 14 is provided with an aperture 15 having two keying slots 15. As shown in FIG. 5, the fastener 2 is inserted into the aperture 15, with the first engagement projections 5 keying into the keying slots 15, and the shaft 8 and ball stud 3 extending through the aperture 15. The distal facing surface of the collar 4 is flat and seats against the circuit board 14 surface around the aperture 15. During assembly, the fastener 2 may be inserted into the aperture 15 as part of the surface mounted device (SMD) process. That is, the fastener 2 may be automatically picked and placed onto the circuit board 14 along with other surface mounted components (i.e. electrical components), thereby avoiding the need for additional handling. The fastener 2 and the aperture 15 may form a press-fit to prevent the fastener 2 from falling out during transportation. Once the fastener 2 is inserted, the fastener/circuit board assembly may then be connected to the mount 3 by connecting the first and second snap-fit parts, which in turn clamps the circuit board between the mount 3 and the collar 4.

Figure 6:
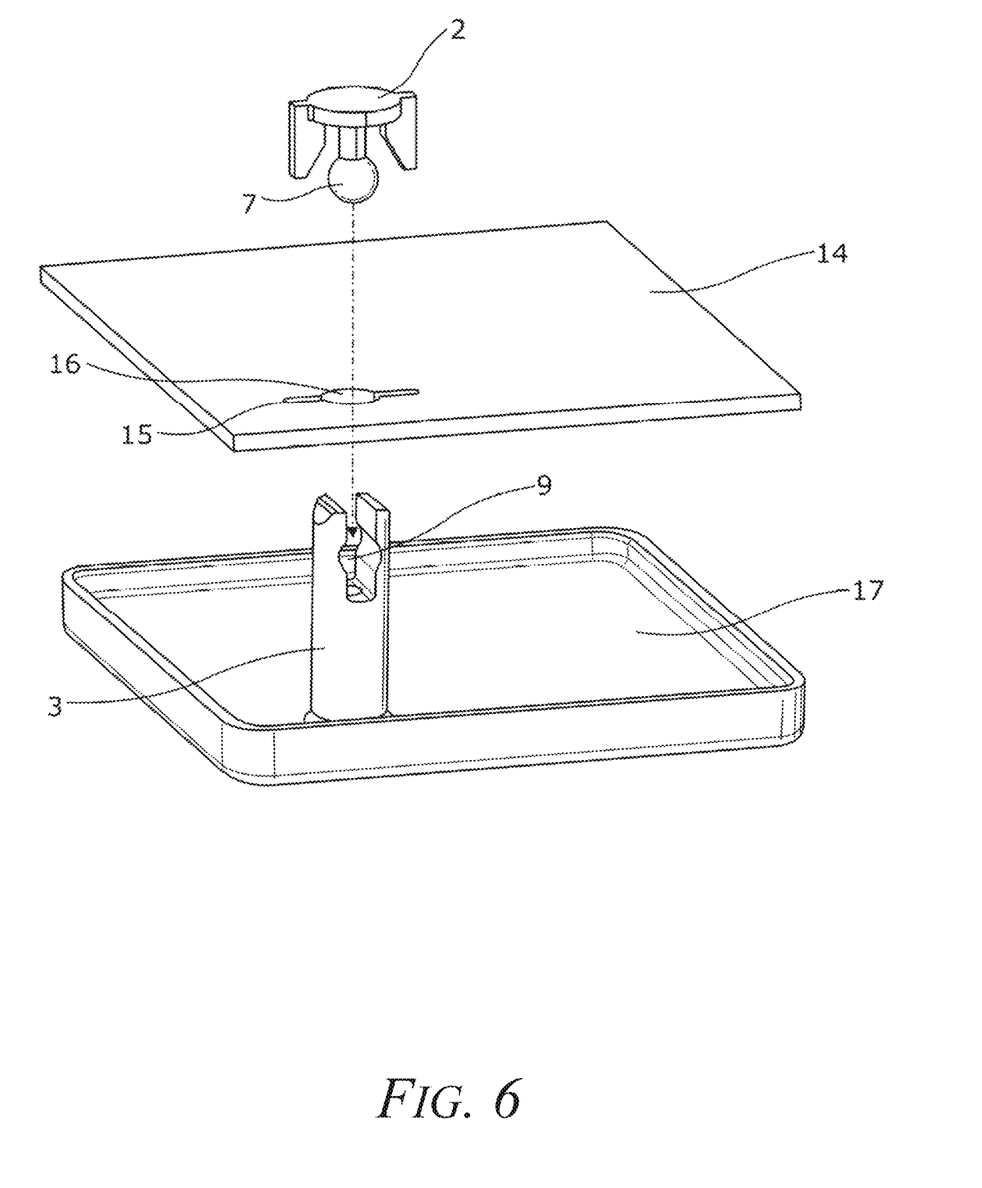
FIG. 6 shows an exploded isometric view of the coupling's fastener, the circuit board, and the mount fixed to a housing component.

FIG. 6 shows an exploded isometric view of the coupling when the mount 3 is provided on a housing component 17. In this example, the mount 3 is formed integrally with the housing component 17, which in turn may be connected to other components within a larger assembly. Only a single mount 3 has been shown in this illustration, but it will be understood that a plurality of mounts may be provided for supporting the circuit board 14 in different areas.

Figure 7:
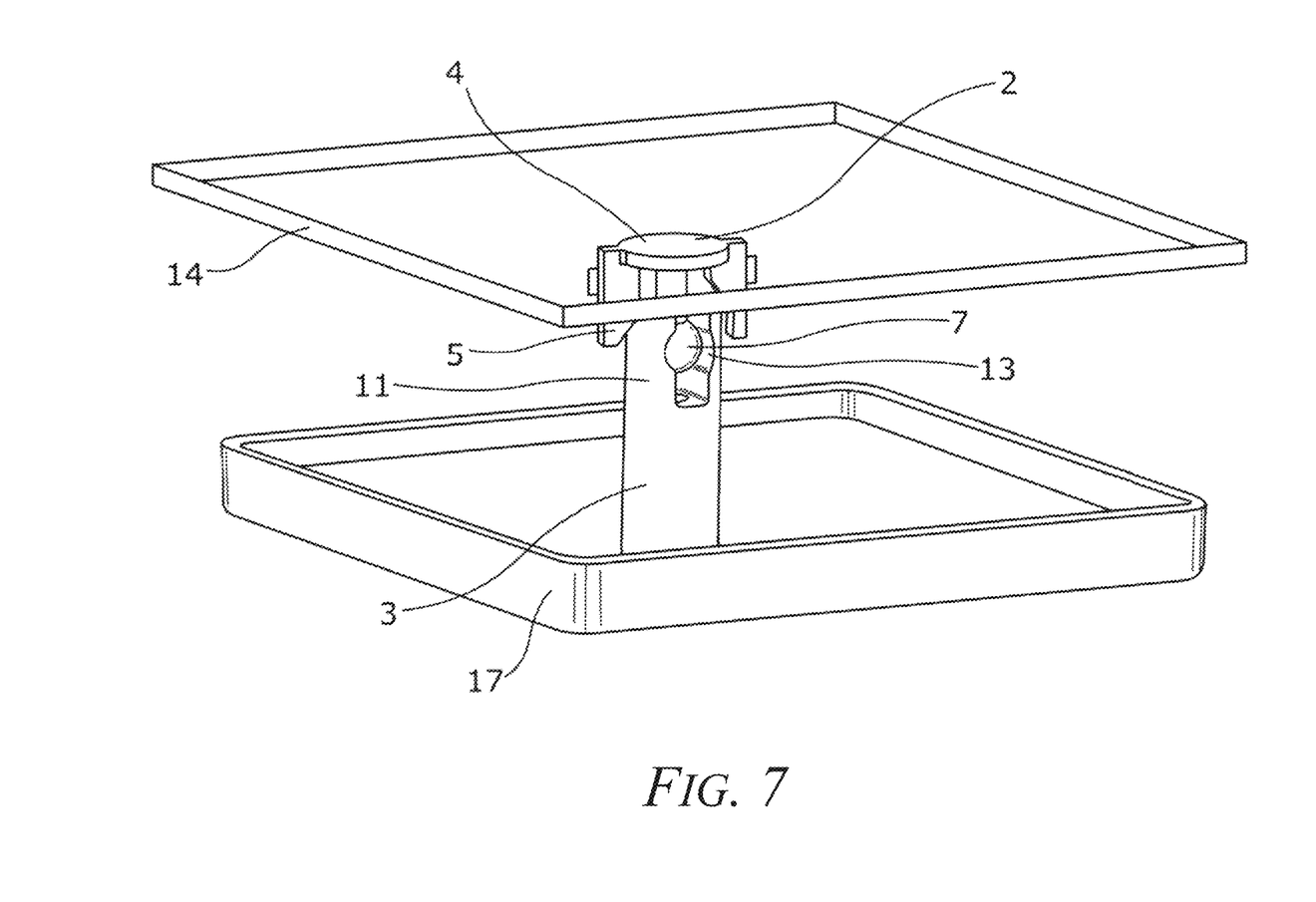
FIG. 7 shows an isometric view of the coupling securing the circuit board to the cover.
Figure 8:
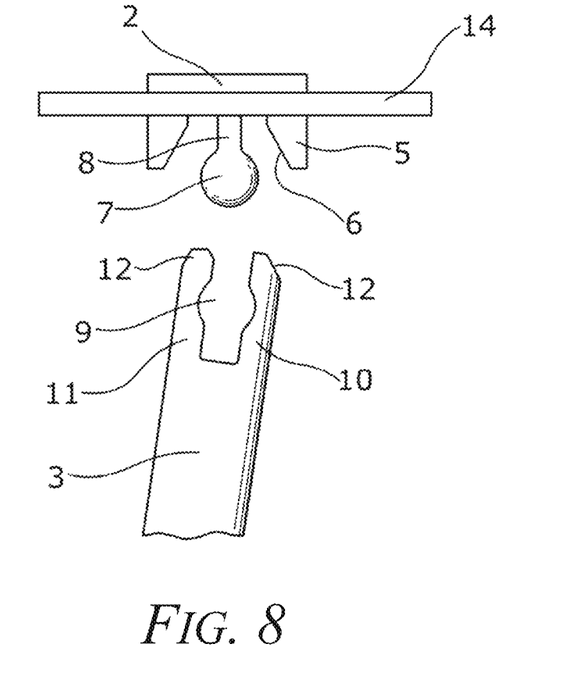
FIG. 8 shows a side view of a coupling of a second embodiment with a circuit board when unconnected.

FIG. 7 shows the components shown in FIG. 6 once assembled, with the circuit board clamped between the collar 4 and the mount 3. In FIG. 7, the circuit board is shown with a transparent interior for visualising the extension of the first engagement projections 5 and the shaft 8 though the keying slots 15, and aperture 16.

Accordingly, the above arrangement provides an attachment coupling for fixing a circuit board without the need for screws. Not only does this eliminate the need for screws as a component cost, but it also avoids the need for specialised connection jigs, robots, or cleaning stations, which are often necessary with screw assemblies. As a consequence, production cycle times may be reduced, as well as mitigating the risk of damage caused by screwing. Indeed, because the fastener is provided as a separate component, it can be easily replaced if it is incidentally damaged, without needing to replace the whole circuit board. Similarly, the provision of a separate plastic fastener provides an electrically isolating connection, with a circuit board space requirement that is comparable to that needed for screw connections.

Figure 9:
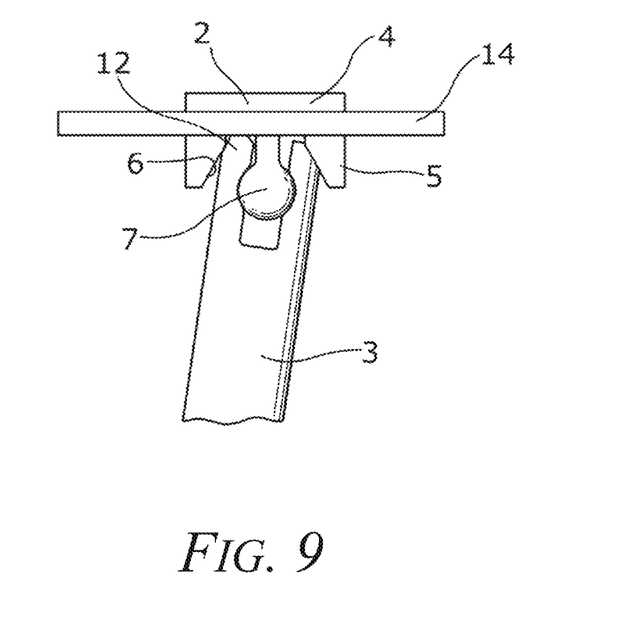
FIG. 9 shows a side view of a coupling of the second embodiment with a circuit board when connected.

FIGS. 9 and 10 respectively show side views of a coupling of the second embodiment in an unconnected and a connected state. This embodiment is substantially the same as the first embodiment above, except that the second engagement surfaces 12 are profiled for clamping the circuit board 14 to an inclined mount 3. That is, rather than fix the circuit board 14 in a plane a perpendicular to the mount's longitudinal axis, the mounting angle may be offset. The support surface at the terminal faces of the mount may also be inclined to seat the circuit board in the desired plane. This thereby allows the circuit board 14 to be supported using mounts with different inclinations, thereby providing flexibility to support the circuit board from different positions on the underlying component. This flexibility is not possible with screw mounts because it is necessary for a screw to be driven concentrically into the mount to avoid damage to the mount itself.

It will be understood that, whilst in this second embodiment, the second engagement surfaces 12 are profiled for providing the inclined fastener position, the first engagement surfaces 6, or a combination of both surfaces, may be configured to achieve the same result. That said, the advantage of configuring the second engagement surfaces 12 is that the same fastener 2 can be used for different mounts.

It will be understood that the embodiments illustrated above show applications only for the purposes of illustration. In practice, embodiments may be applied to many different configurations, the detailed embodiments being straightforward for those skilled in the art to implement.

What is claimed is:

1. An apparatus, comprising:
   a fastener that connects a circuit board to a mount, the fastener comprising:
   a first snap-fit connection formation that establishes a snap-fit connection with a second snap-fit connection formation provided on the mount to secure the circuit board to the mount; and
   a first engagement formation that engages with a second engagement formation on the mount for bracing the snap-fit connection, the first engagement formation keying through an aperture provided in the circuit board for preventing rotation of the circuit board relative to the fastener once the snap-fit connection is established.

2. The apparatus according to claim 1, wherein, when connected, the fastener clamps the circuit board against the mount.

3. The apparatus according to claim 2, further comprising a collar that clamps the circuit board against the mount.

4. The apparatus according to claim 1, wherein the first snap-fit connection formation comprises a male snap-fit member and the second snap-fit connection formation comprises a female snap-fit member that receives the male snap-fit member.

5. The apparatus according to claim 4, wherein the male snap-fit member comprises a stud projection engaged with a detent defined within the female snap-fit member.

6. The apparatus according to claim 5, wherein the stud projection is a ball stud.

7. The apparatus according to claim 1, wherein engagement of the first engagement formation with the second engagement formation prevents deflection of one of the first and second snap-fit connection formations.

8. The apparatus according to claim 1, wherein the first engagement formation comprises a projection engaged with the second engagement formation provided on an outer surface of the second snap-fit connection formation.

9. The apparatus according to claim 1, wherein at least one of the first and second engagement formations comprises a tapered surface.

10. The apparatus according to claim 1, wherein engagement of the first engagement formation with the second engagement formation defines an axial alignment of the fastener relative to the mount.

11. An apparatus, comprising:
a mount that receives a fastener for connecting a circuit board to the mount, the mount comprising:
a second snap-fit connection formation that establishes a snap-fit connection with a first snap-fit connection formation provided on the fastener to secure the circuit board to the mount; and
a second engagement formation that engages with a first engagement formation on the fastener for bracing the snap-fit connection, the second engagement formation keying through an aperture provided in the circuit board for preventing rotation of the circuit board relative to the fastener once the snap-fit connection is established.

12. The apparatus according to claim 11, wherein the second snap-fit connection formation comprises two or more resiliently deformable arms defining a female snap-fit member, and wherein the first snap-fit connection formation comprises a male snap-fit member that inserts into the female snap-fit member.

13. The apparatus according to claim 12, wherein the second engagement formation is provided on an outer surface of the two or more resiliently deformable arms such that engagement by the first engagement formation braces the two or more resiliently deformable arms for preventing their deformation.

14. A system, comprising:
a coupling that connects a circuit board to a component, the coupling comprising:
a mount connected to the component; and
a fastener connected to the mount to secure the circuit board to the mount, the fastener comprising:
a first snap-fit connection formation that establishes a snap-fit connection with a second snap-fit connection formation provided on the mount for securing the circuit board thereto; and
a first engagement formation that engages with a second engagement formation on the mount for bracing the snap-fit connection, the first engagement formation keying through an aperture provided in the circuit board for preventing rotation of the circuit board relative to the fastener once the snap-fit connection is established.

15. The system of claim 14, wherein the second snap-fit connection formation comprises two or more resiliently deformable arms defining a female snap-fit member, and wherein the first snap-fit connection formation comprises a male snap-fit member for insertion into the female snap-fit member.

16. The system of claim 15, wherein the second engagement formation is provided on an outer surface of the two or more resiliently deformable arms such that engagement by the first engagement formation braces the two or more resiliently deformable arms for preventing their deformation.

17. The system according to claim 14, wherein, when connected, the fastener clamps the circuit board against the mount.

18. The system according to claim 14, wherein the fastener further comprises a collar that clamps the circuit board against the mount.

19. The system according to claim 14, wherein engagement of the first engagement formation with the second engagement formation defines an axial alignment of the fastener relative to the mount.

20. The system according to claim 14, wherein engagement of the first engagement formation with the second engagement formation prevents deflection of one of the first and second snap-fit connection formations.

* * * * *